(12) United States Patent
Atallah

(10) Patent No.: US 6,256,764 B1
(45) Date of Patent: *Jul. 3, 2001

(54) METHOD AND SYSTEM FOR DECODING TAILBITING CONVOLUTION CODES

(75) Inventor: Isa Bisher Atallah, Plano, TX (US)

(73) Assignee: Nortel Networks Limited, Montreal (CA)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/979,414

(22) Filed: Nov. 26, 1997

(51) Int. Cl.⁷ .................................................. H03M 13/03
(52) U.S. Cl. ..................... 714/795; 714/786; 714/792; 714/794
(58) Field of Search ........................ 341/107; 714/775, 714/774, 791, 792, 794, 795; 375/290

(56) References Cited

U.S. PATENT DOCUMENTS

| | | | |
|---|---|---|---|
| 5,159,610 | * 10/1992 | Eyuboglu et al. ................ | 714/791 |
| 5,208,816 | * 5/1993 | Seshardi et al. ................. | 375/290 |
| 5,287,374 | * 2/1994 | Parr ................................. | 714/774 |
| 5,349,589 | * 9/1994 | Chennakeshu et al. ........ | 714/795 |
| 5,355,376 | 10/1994 | Cox et al. ........................ | 714/795 |
| 5,475,388 | * 12/1995 | Gormish et al. ................ | 341/107 |
| 5,615,286 | * 3/1997 | Patel ................................ | 382/224 |
| 5,721,745 | * 2/1998 | Hladik et al. ................... | 714/755 |
| 5,721,746 | * 2/1998 | Hladik et al. ................... | 714/792 |
| 5,935,270 | * 8/1999 | Lin .................................. | 714/795 |

OTHER PUBLICATIONS

Howard H. Ma et al., "On Tail Biting Convolutional Codes," IEEE Transactions on Communications, vol. 34, No. 2, Feb. 1986, pp. 104–110.

Richard Cox et al., "An Efficient Adaptive Circular Viterbi Algorithm for Decoding Generalized Tailbiting Convolutional Codes," IEEE Transactions on Vehicular Technology, vol. 43, No. 1, Feb. 1994, pp. 57–68.

Qiang Wang et al., "An Efficient Maximum Likelihood Decoding Algorithm for Generalized Tail Biting Convolutional Codes Including Quasicyclic Codes," IEEE Transactions on Communications, vol. 37, No. 8, Aug. 1989, pp. 875–879.

IEEE Transactions On Communications, vol. 32, No. 3, Mar. 1984, pp. 315–319.

IEEE Transactions On Information Theory, vol. 25, No. 1, Jan. 1979, pp. 97–100.

\* cited by examiner

*Primary Examiner*—Albert Decady
*Assistant Examiner*—David Ton
(74) *Attorney, Agent, or Firm*—John D. Crane; Bracewell & Patterson, L.L.P.

(57) ABSTRACT

A method and system for decoding tailbiting convolution codes are disclosed. A set of tailbiting convolutional codes is encoded by a convolutional encoder having multiple encoding states. A first starting score is assigned to each of the encoding states. A Viterbi algorithm is then performed once on the tailbiting convolutional code to associate an ending score with each of the encoding states. A subset of these encoding states is subsequently selected, within which the ending score of each encoding state meets a certain criterion. The Viterbi algorithm is again performed on the tailbiting convolutional code for each encoding state within the subset to determine the best encoding state as the most likely initial encoding state for the tailbiting convolutional code. A Trellis path of this most likely initial encoding state is utilized to decode the tailbiting convolutional code.

18 Claims, 5 Drawing Sheets

METHOD AND SYSTEM FOR DECODING TAILBITING CONVOLUTION CODES

BACKGROUND OF THE INVENTION

1. Technical Field

The present invention relates to a method and system for error correcting codes in general, and in particular to a method and system for decoding convolutional codes. Still more particularly, the present invention relates to a method and system for decoding tailbiting convolutional codes.

2. Description of the Prior Art

Information signals communicated between a transmitter and a receiver via a communication channel can be corrupted by various noises associated with the channel. Thus, a technique known as error correction coding is typically employed to mitigate the effects of channel noises within a communication channel. By introducing redundancy in the information signals to be communicated, channel coding can reduce the likelihood of channel noise corrupting the information signals. In most cases, the technique of channel coding has been proven to be quite successful, even for long distance communications such as between a base station on Earth to a spacecraft approaching a distant planet.

Convolutional codes are a class of error correcting codes that are well-known in the art for mitigating the effects of channel noise. One example of such convolutional codes, which has been adopted as a standard for North American digital cellular radio communications, is known as IS-130 by the International Telecommunication Union. IS-130 employs a type of convolutional code that is also known in the art as a tailbiting convolutional code, in which a frame or block of information is encoded and communicated in a blockwise manner. The term tailbiting refers to the fact that the convolutional encoder begins and ends in the same encoding state. Although the decoder is aware that the encoder begins and ends in the same encoding state, the decoder is unaware of the value of that state. In other words, the initial encoding state of the encoder is unknown to the decoder; and in fact, for arbitrary data, the encoder may have started in any of the possible states with approximately the same probability. Hence, the fundamental difficulty encountered in designing a decoder for tailbiting convolutional codes is that the decoder must be capable of determining the initial encoding state of the encoder in a very short time.

In the prior art, a maximum-likelihood decoder, better known as a Viterbi decoder, may be utilized for decoding tailbiting convolutional codes. A Viterbi decoder decodes an actual corrupted sequence of received signals by finding the most likely sequence of uncorrupted signals. Similar to other types of decoders, a Viterbi decoder is also unaware of an encoder's starting state, hence the Viterbi decoder must perform Viterbi decoding exhaustively for all possible starting states. Although the outcome is always correct, this method is unacceptably slow for many applications. For example, if the number of the storage elements in the encoder is K, the time to decode is always $2^K$ longer than that of the encoder's non-tailbiting counterpart. As a result, a Viterbi decoder places great demands on computational resources. Needless to say, it would be desirable to provide an improved technique for decoding tailbiting convolutional codes, which yields good levels of error protection with less computational burden.

SUMMARY OF THE INVENTION

In view of the foregoing, it is therefore an object of the present invention to provide an improved method and system for decoding error correcting codes.

It is another object of the present invention to provide an improved method and system for decoding convolutional codes.

It is yet another object of the present invention to provide an improved method and system for decoding tailbiting convolutional codes.

In accordance with the method and system of the present invention, a tailbiting convolutional code is encoded by a convolutional encoder having multiple encoding states. A first starting score is assigned to each of the encoding states. A Viterbi algorithm is then performed once on the tailbiting convolutional code to associate an ending score with each of the encoding states. A subset of these encoding states is subsequently selected, within which the ending score of each encoding state meets a certain criterion. The Viterbi algorithm is again performed on the tailbiting convolutional code for each encoding state within the subset to determine the best encoding state as the most likely initial encoding state for the tailbiting convolutional code. A Trellis path of this most likely initial encoding state is utilized to decode the tailbiting convolutional code.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention may be implemented in any cellular telephone communications network. As will be understood by those skilled in the art, the present invention is applicable to cellular base stations, cellular subscriber units, and more generally, any communications systems that must decode tailbiting convolutional codes.

Figure 1:
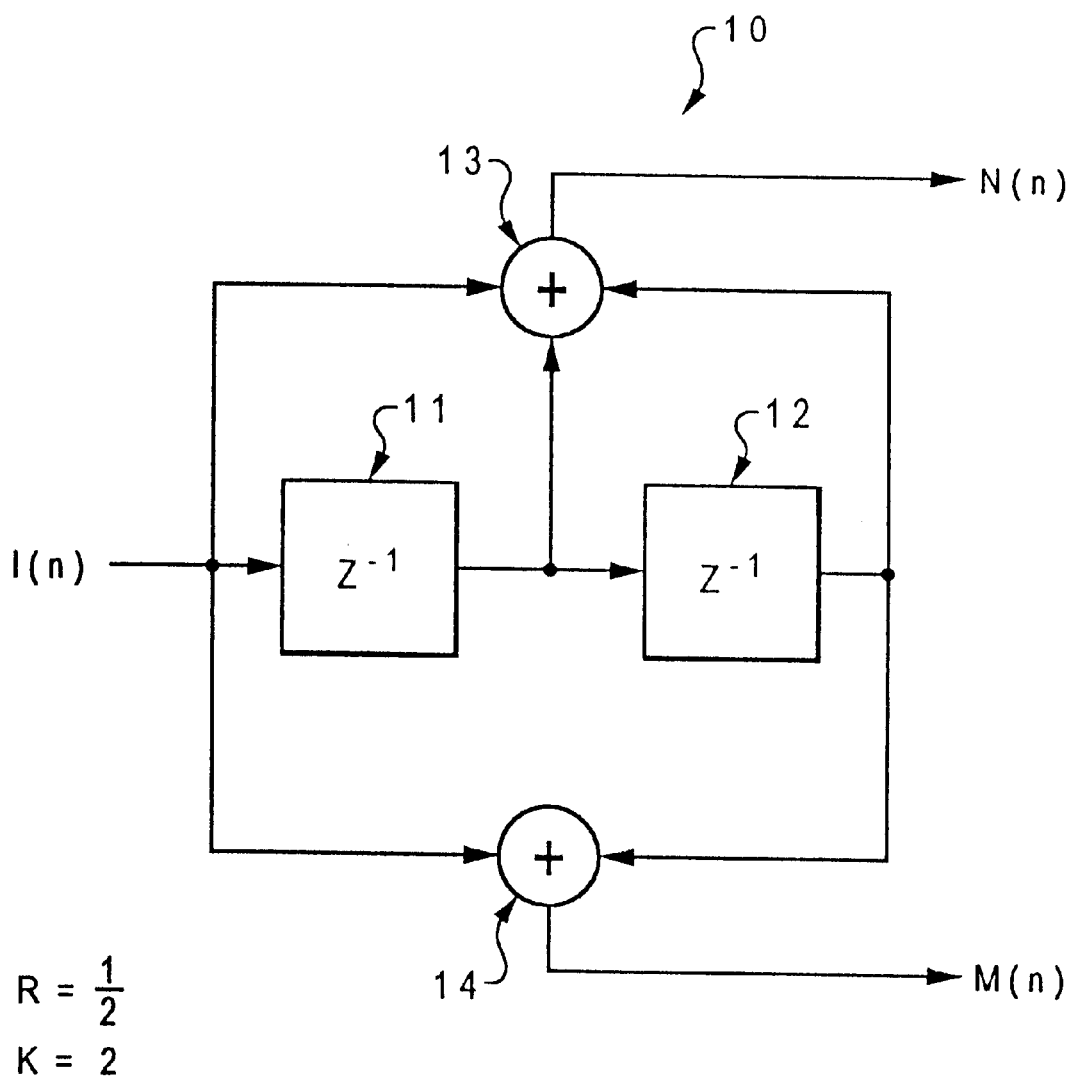
FIG. 1 is a block diagram of a convolutional encoder under the prior art.

Referring now to the drawings and in particular to FIG. 1, there is depicted a block diagram of a convolutional encoder under the prior art. As shown, convolutional encoder 10 includes two single-bit memory cells 11, 12 and two adder circuits 13, 14. Memory cell 11 and adder circuits 13, 14 first receive a sequence of information signals, I(n), to be encoded. Memory cell 11 then provides its contents to memory cell 12 with each new information signal memory cell 11 receives.

Convolutional encoder 10 comprises two paths, each path including an adder circuit and connections to the information signal stream and one or both of memory cells 11, 12. The output N(n) of the first path that includes adder circuit 13 is generated by adding together the current signal bit and the two previous signal bits. If the resulting sum is odd, adder 13 outputs a logical one; but if the resulting sum is even, adder 13 outputs a logical zero. The output M(n) of the second path that includes adder circuit 14 is generated by adding together the current signal bit and the signal bit that is two bits earlier than the current signal bit. Again, if the resulting sum is odd, adder 14 outputs a logical one; but if the resulting sum is even, adder 14 outputs a logical zero. Because only three bits are utilized to determine a two-bit output, convolutional encoder 10, having two memories, is said to have a "constraint length" of three. In addition, convolutional encoder 10 is also known as a "rate ½" convolutional encoder because for every information signal bit to be encoded, it produces two bits of output signal.

Figure 2:
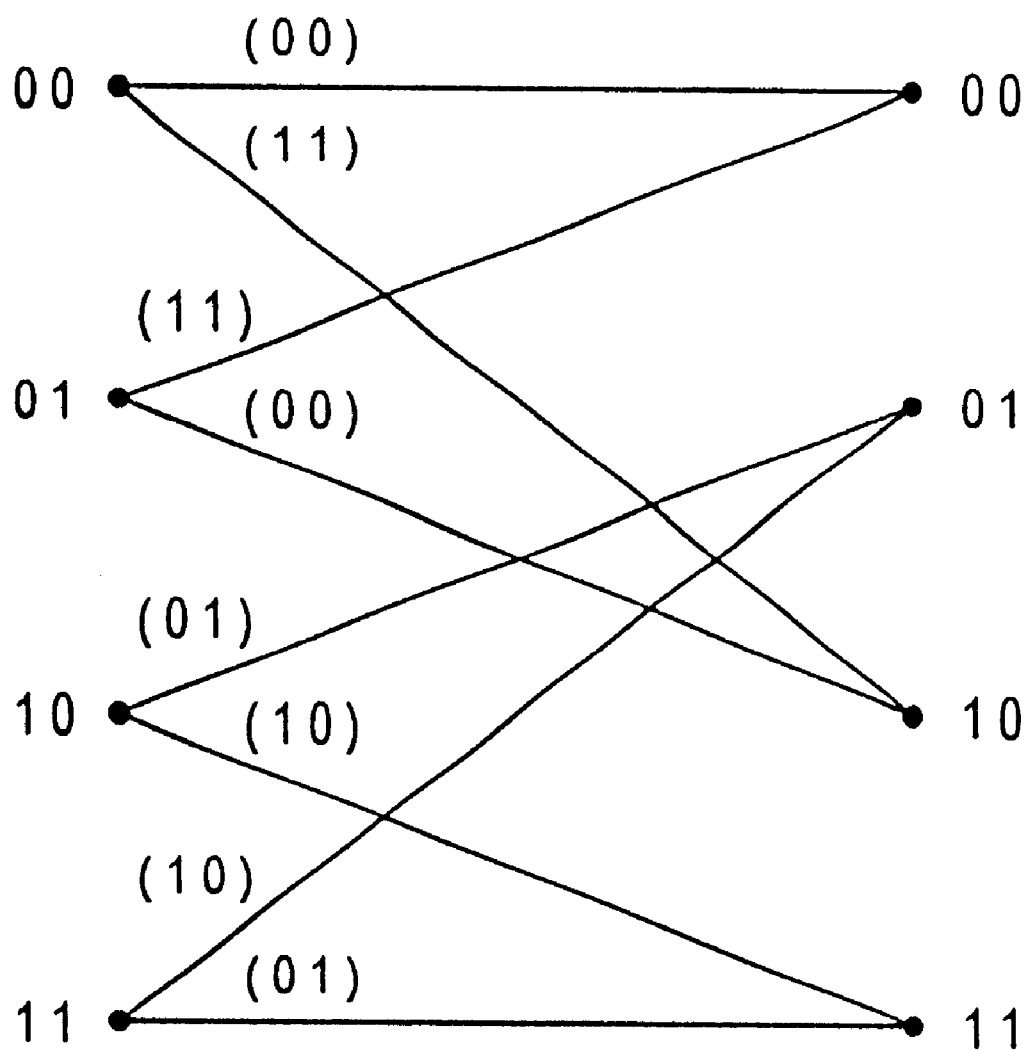
FIG. 2 is a Trellis diagram that depicts the operation of the convolutional encoder shown in FIG. 1.

With reference now to FIG. 2, there is illustrated a Trellis diagram that depicts the operation of the convolutional encoder shown in FIG. 1. The Trellis diagram describes how the states of the convolutional encoder ("encoder") can change from one information signal bit time to the next. A state of the encoder is simply the contents of the encoder memory cells at any one time, read as a state "word." On both the left and right sides of the Trellis diagram are the allowable states of the encoder—00, 01, 10, and 11. The states shown on the left side of the Trellis diagram represent the current state of the encoder, while the states on the right side of the Trellis diagram represent the next state of the encoder.

Starting at the top left side of the Trellis diagram, the encoder is in state 00 when the two previous signal bits are both zero (i.e., the contents of memory cells 11 and 12 in FIG. 1 are both 0s). If the current signal bit is a one, the arrival of a next subsequent signal bit will move the encoder to state 10. In other words, with the arrival of the next subsequent signal bit, the bit in memory cell 12 is replaced by the bit from memory cell 11 (a zero), and the bit in memory cell 11 is replaced by the current bit (a one). This transition is indicated by the diagonal line beginning at the current state 00 on the top left of the Trellis diagram and extending downward and across to the next state 10, the second state from the bottom on the right side of the Trellis diagram. With this state transition, the output of the encoder is an 11, as indicated within parentheses over the diagonal line. However, if the current signal bit is a zero instead of a one, the arrival of the next subsequent signal bit will move the encoder to the same state, 00 (the horizontal line from the top left side to the top right side of the Trellis diagram). With this state transition, the output of the encoder is a 00, as indicated within parentheses over the diagonal line.

The Trellis diagram in FIG. 2 indicates all allowable state transitions by the encoder with a solid line connecting the respective states. As shown, some state transitions are not allowable. For example, the encoder cannot move from state 00 to state 11 (note the absence of a line connecting state 00 on the left side with state 11 on the right side). This is attributed to the fact that the bits in the memory cells (states) can only be changed one bit at a time.

Figure 3:
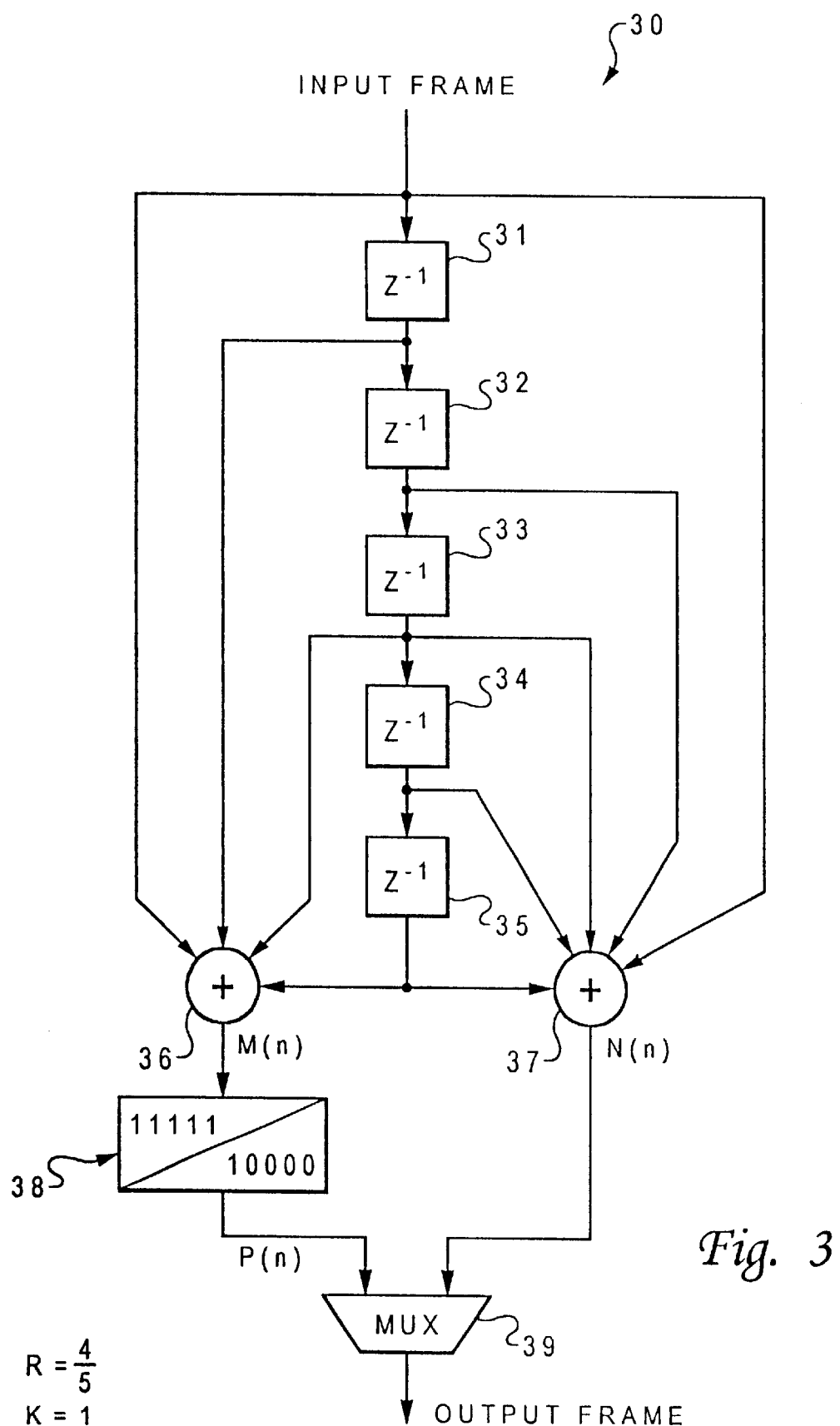
FIG. 3 is a block diagram of a high-rate punctured convolutional encoder to be utilized in conjunction with a preferred embodiment of the present invention.

Referring now to FIG. 3, there is illustrated a block diagram of a high-rate punctured convolutional encoder to be utilized in conjunction with a preferred embodiment of the present invention. As shown, convolutional encoder 30 includes five single-bit memory cells 31–35, two adder circuits 36, 37, a puncture element 38, and a multiplexer 39. Data frames are input via memory cells 31 and output via multiplexer 39. By utilizing a puncture element 38, only one M(n) is output as P(n) per every five N(n)s such that the data throughput of convolutional encoder 30 is significantly higher than the traditional convolutional encoder shown in FIG. 1.

It is understood by those who are skilled in the art that the Trellis diagram for convolutional encoder 30 will be similar to that shown in FIG. 2. The main difference is that convolutional encoder 30 has five memory cells, hence its Trellis diagram has $2^5=32$ encoding states. When operating on non-tailbiting codes, a convolutional decoder has the luxury of assuming that convolutional encoder 30 was in encoding state 00000 when a first signal bit was transmitted. However, this is no longer the case with tailbiting codes. In fact, for arbitrary data, convolutional encoder 30 may have started in any of the 32 possible encoding states with approximately equal probability.

In the prior art, there is a simple yet very time-consuming method to decipher the starting state of a convolutional encoder that utilizes tailbiting codes. Taking the convolutional encoder in FIG. 1 for example, if tailbiting codes were utilized, the decoding process would begin by first assuming the starting state of the convolutional encoder is 00. Then, the Viterbi algorithm is performed as is well-known in the art. A more detailed discussion of the Viterbi algorithm can be found in Lin et al., *Error Control Coding: Fundamentals and Applications,* Prentice Hall, 1983, and it is incorporated herein by reference. The result of the best Trellis path and its score will then be recorded. Then, the starting state of the convolutional encoder is assumed to be 01, and the Viterbi algorithm is performed again. Next, the Viterbi algorithm will be separately performed with the assumption of the initial states being 10 and 11. Of the four paths and scores collected from all the runs above, a path having the lowest score will be selected as the most likely input path. This algorithm is always right, but unacceptably slow for a larger convolutional encoder such as convolutional encoder 30, which has 32 states.

Figure 4:
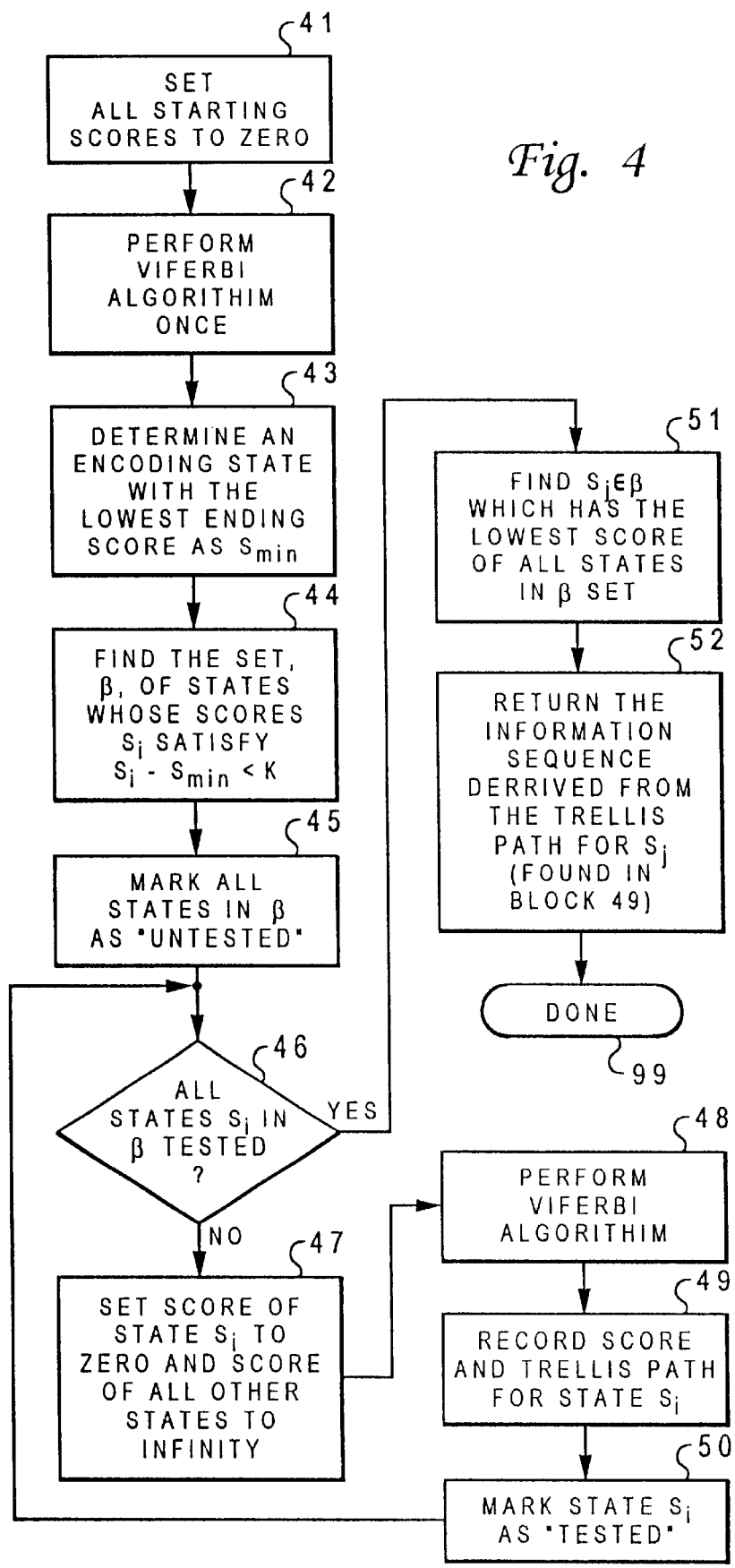
FIG. 4 is a high-level logic flow diagram depicting a method for decoding tailbiting convolutional codes, in accordance with a preferred embodiment of the present invention.

With reference now to FIG. 4, there is illustrated a high-level logic flow diagram depicting a method for decoding tailbiting convolutional codes, in accordance with a preferred embodiment of the present invention. The tailbiting convolutional codes may be encoded by a high-rate punctured tailbiting convolutional encoder having, for example, 32 encoding states such as the one shown in FIG. 3. A constant K for the convolutional encoder is assigned to be $\lfloor 1/R \rfloor$, where R is the coding rate of the convolutional encoder, and in this example, $K=\lfloor 5/4 \rfloor=1$. Each of the 32 possible encoding states of the convolutional encoder is associated with an identical starting score. The starting score can be any number, as long as it is the same for all encoding states. In other words, all 32 encoding states of the convolutional encoder are assumed to have an equal probability to be the starting state. In this example, the starting score is equal to zero, as shown in block 41. A modified Viterbi algorithm is then performed once on the set of convolutional codes to provide an ending score for each of the 32 encoding states, as depicted in block 42.

The modified Viterbi algorithm is performed as follows: (1) set a time variable, t, to 1; (2) for each encoding state $S_i$, where i=1 to 32, determine a partial score associated with each of the two Trellis arcs into that state; (3) compute the absolute score of the two Trellis arcs by adding to their partial scores with the score of the encoding state from which they emanated at time t−1; (4) pick the arc entering state Si with the smallest absolute score, Z; (5) record Z as $S_i$'s new score for time t and append the chosen Trellis arc to its associated Trellis path; (6) increase t by one; and (7)

if t is less than L−1, where L is the length of the information sequence from which the tailbiting convolutional code is generated, repeat (2) through (7), otherwise, stop.

Subsequently, the encoding state with the lowest ending score is determined, as illustrated in block 43, and may be denoted as $S_{min}$. All encoding states with an ending score that satisfies the condition $S_i-S_{min}<K$ are grouped under a set of encoding states denoted as β set, as shown in block 44. All the encoding states in fi are then marked as "untested," as depicted in block 45.

A determination is then made as to whether or not all encoding states $S_i$ within β are tested, as shown in block 46. If all encoding states within β are not tested, then the score of an encoding-state-under-test is set to zero and the score of all other encoding states are set to infinity, as shown in block 47. The classical Viterbi algorithm is then performed to provide an ending score and a Trellis path for each encoding state, as depicted in block 48. The best ending score and the associated Trellis path for encoding-state-under-test are recorded, as illustrated in block 49. The encoding-state-under-test is then marked as "tested," as shown in block 50. The steps shown in block 47 through block 50 will be performed for all "untested" encoding states within β.

After all the encoding states within β have been tested, the encoding state $S_j$ which has the lowest score among all encoding states within β is located, as shown in block 51. Note that j equals the number of the corresponding encoding-state-under-test. Finally, the information sequence derived from the Trellis path for this lowest score encoding state is obtained (from block 49), as depicted in block 52, and the process exits at block 99.

Figure 5:
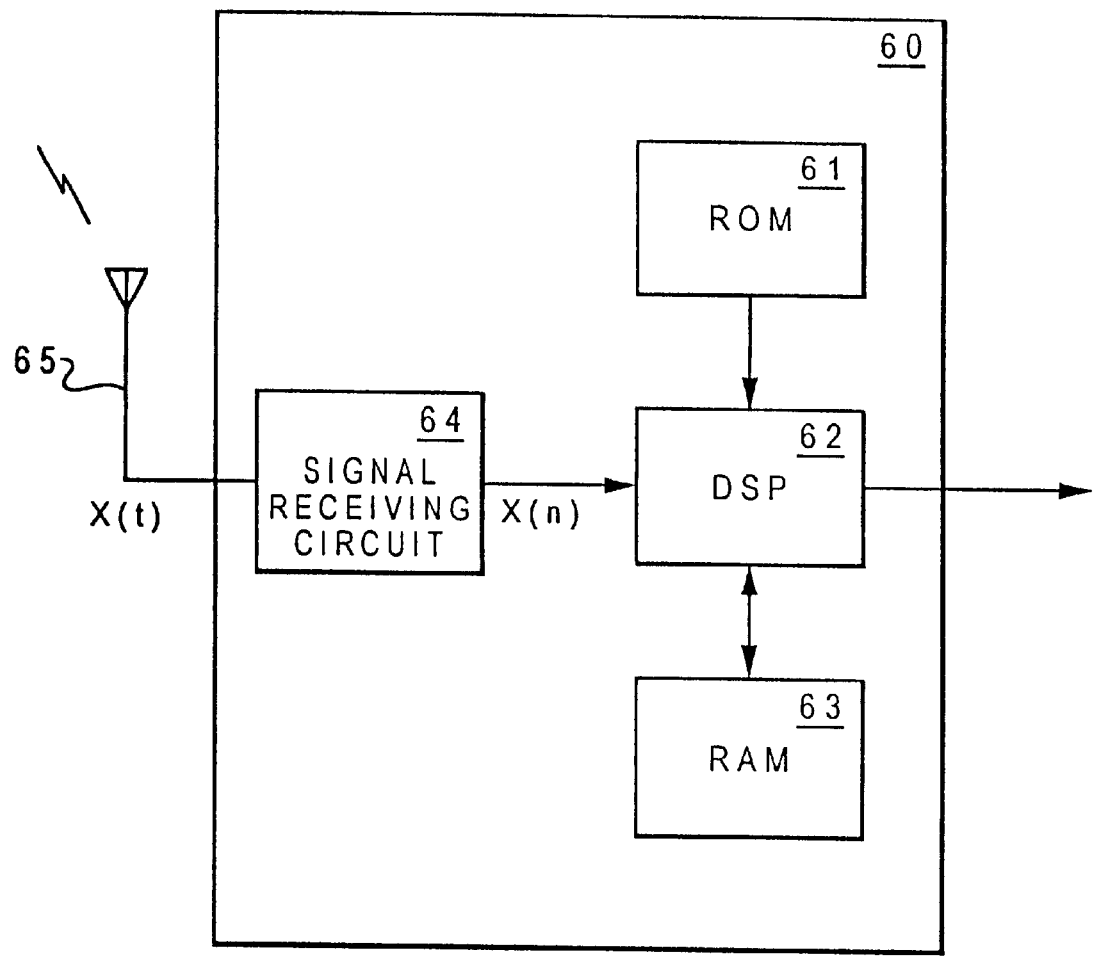
FIG. 5 is a block diagram of a radio signal receiving system in which a preferred embodiment of the present invention as depicted in FIG. 4 may be incorporated.

Referring now to FIG. 5, there is depicted a block diagram of a radio signal receiving system in which a preferred embodiment of present invention as depicted in FIG. 4 may be incorporated. As shown, radio signal receiving system 60 includes a read-only memory (ROM) 61, a digital signal processor (DSP) 62, a random-access memory (RAM) 63, and a signal receiving circuit 64. In addition, radio receiver system 60 is also coupled to an antenna 65 that receives analog radio signals x(t). The analog radio signals x(t) are then converted into digital signals x(n) by signal receiving circuit 64 coupled between antenna 65 and DSP 62. ROM 61 stores, inter alia, software utilized for controlling the operation of DSP 62 and for decoding tailbiting convolutional codes. On the other hand, RAM 63 stores, inter alia, a buffer of output frames to be processed by the above-mentioned software.

As has been described, the present invention provides an accurate, efficient method that a tailbiting convolutional decoder may utilize to decode tailbiting convolutional codes. The decoder in the present invention first associates an initial score with each of the $2^M$ possible starting states of the encoder. The decoder then executes a Viterbi algorithm once in order to determine a new set of $2^M$ ending scores. Note that this set of scores outlines a probability density function that indicates the most likely starting states of the encoder. In particular, if $S_x$ is the ending score for state X, then the probability that the encoder started in state X is given by:

$$p(x) = \frac{e^{-S_x}}{\sum_{j=0}^{M} e^{-S_j}}$$

With this knowledge, the decoder can select a smaller subset, β, of the $2^M$ states whose $S_x$ scores are minimal (i.e., whose p(x) values are maximal). Finally, like the prior art, the Viterbi algorithm is exhaustively executed on each of the starting states in β. Because the number of states in β is a much smaller than $2^M$, the total execution time is dramatically reduced as compared to the prior art, while the accuracy is essentially unaffected. As a result, the method of the present invention is able to find, with very high probability, the maximum likelihood path of an encoder. The method of the present invention works equally well on low-rate (e.g., rate ½) and high-rate (e.g., rate ⅕) convolutional codes, in which hard-decision decoding techniques are utilized. It also works well if soft-decision techniques are utilized.

It is also important to note that the mechanisms of the present invention are capable of being distributed as a program product in a variety of forms, and that the present invention applies equally regardless of the particular type of signal bearing media utilized to actually carry out the distribution. Examples of signal bearing media include without limitation recordable type media, such as floppy disks or CD ROMs, and transmission type media, such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for decoding tailbiting convolutional codes, wherein said tailbiting convolutional codes, which are encoded by a convolutional encoder, include a plurality of encoding states, said method comprising the steps of:

assigning an identical first staring score to each of a plurality of encoding states of a tailbiting convolutional code;

performing a Viterbi algorithm once on all of said encoding states of said tailbiting convolutional code to associate a first ending score with each of said encoding states;

performing said Viterbi algorithm again for each of said encoding states having a first ending score meeting a certain criterion to associate a second ending score with each of said encoding states, wherein the number of encoding states having a first ending score that meets the certain criterion equals the number of times said Viterbi algorithm is performed again; and decoding said tailbiting convolutional code utilizing a Trellis path having as an initial encoding state one of said encoding states having a lowest second ending score.

2. The method according to claim 1, wherein said identical first starting score is a zero.

3. The method according to claim 1, wherein said step of performing said Viterbi algorithm again on said tailbiting convolutional code further includes a step of assigning a second starting score to an encoding state having a first ending score meeting said certain criterion, and a step of assigning identical third starting scores to all remaining encoding states when performing said Viterbi algorithm for each of said encoding states having a first ending score meeting said certain criterion.

4. The method according to claim 3, wherein said identical third starting score is an infinity.

5. The method according to claim 3, wherein said second starting score is zero.

6. The method according to claim 1, wherein said certain criterion is defined by $S_i-S_{min}=K$, wherein $S_i$=an encoding state: having a first ending score, $S_{min}$ is an encoding state having a lowest first ending score, and K is a constant.

7. A data processing system for decoding tailbiting convolutional codes, wherein said tailbiting convolutional codes, which are encoded by a convolutional encoder, include a plurality of encoding states, said computer system comprising:

means for assigning an identical first starting score to each of a plurality of encoding states of a tailbiting convolutional code;

means for performing a Viterbi algorithm once on all of said encoding states of said tailbiting convolutional code to associate a first ending score with each of said encoding states;

means for performing said Viterbi algorithm again for each of said encoding states having a first ending score meeting a certain criterion to associate a second ending score with each of said encoding states, wherein the number of encoding states having a first ending score that meets the certain criterion equals the number of times said Viterbi algorithm is performed again; and means for decoding said tailbiting convolutional code utilizing a Trellis path having as an initial encoding state one of said encoding states having a lowest second ending score.

8. The computer system according to claim 7, said identical first starting score is zero.

9. The computer system according to claim 7, wherein said means for performing said Viterbi algorithm again on said tailbiting convolutional code further includes a means for assigning a second starting score to an encoding state having a first ending score meeting said certain criterion, and a means for assigning identical third starting scores to all remaining encoding states when performing said Viterbi algorithm for each of said encoding states having a first ending score meeting said certain criterion.

10. The computer system according to claim 9, wherein said identical third starting score is an infinity.

11. The computer system according to claim 9, wherein said second starting score is zero.

12. The computer system according to claim 7, wherein said certain criterion is defined by $S_i - S_{min} = K$, wherein $S_i =$ an encoding state having a first ending score, $S_{min}$ is an encoding state having a lowest first ending score, and K is a constant.

13. A computer program product residing on a computer usable medium for decoding tailbiting convolutional codes, wherein said tailbiting convolutional codes, which are encoded by a convolutional encoder, include a plurality of encoding states, said computer program product comprising:

program code means for assigning an identical first starting score to each of a plurality of encoding states of a tailbiting convolutional code;

program code means for performing a Viterbi algorithm once on all of said encoding states of said tailbiting convolutional code to associate a first ending score with each of said encoding states;

program code means for performing said Viterbi algorithm again for each of said encoding states having a first ending score meeting a certain criterion to associate a second ending score with each of said encoding states, wherein the number of encoding states having a first ending score that meets the certain criterion equals the number of times said Viterbi algorithm is performed again; and program code means for decoding said tailbiting convolutional code utilizing a Trellis path having as an initial encoding state one of said encoding states having a lowest second ending score.

14. The computer program product according to claim 13, wherein said identical first starting score is a zero.

15. The computer program product according to claim 13, wherein said program code, means for performing said Viterbi algorithm again on said tailbiting convolutional code further includes a program code means for assigning a second starting score to an encoding state having a first ending score meeting said certain criterion, and a program-code means for assigning identical third star-ting scores to all remaining encoding states when performing said Viterbi algorithm for each of said encoding states having a first ending score meeting said certain criterion.

16. The computer program product according to claim 15, wherein said identical third starting score is an infinity.

17. The computer program product according to claim 15, wherein said second starting score is zero.

18. The computer program product according to claim 13, wherein said certain criterion is defined by $S_i - S_{min} = K$, wherein $S_i =$ an encoding state having a first ending score, $S_{min}$ is an encoding state having a lowest first ending score, and K is a constant.

* * * * *

UNITED STATES PATENT AND TRADEMARK OFFICE
CERTIFICATE OF CORRECTION

PATENT NO.    : 6,256,764 B1                                   Page 1 of 1
DATED         : July 3, 2001
INVENTOR(S)   : Isa B. Atallah It is certified that error appears in the above-identified patent and that said Letters Patent is hereby corrected as shown below:

<u>Column 5,</u>
Line 9, delete "fi" and replace with -- B --.

<u>Column 8,</u>
Line 32, delete "star-ting" and replace with -- starting --.

Signed and Sealed this

Twenty-sixth Day of March, 2002

Attest:

Attesting Officer

JAMES E. ROGAN
*Director of the United States Patent and Trademark Office*